United States Patent [19]

Baenziger et al.

[11] Patent Number: 5,726,413
[45] Date of Patent: Mar. 10, 1998

[54] APPARATUS FOR GENERATING A PLASMA FOR PROCESSING SUBSTRATES

[75] Inventors: Ulrich Baenziger, Hamburg; Gerold Neumann; Hella-C. Scheer, both of Berlin, all of Germany

[73] Assignee: Fraunhofer-Gesellschaft für die angewandte . . .., Munich, Germany

[21] Appl. No.: 687,365

[22] PCT Filed: Feb. 1, 1995

[86] PCT No.: PCT/DE95/00131

§ 371 Date: Aug. 27, 1996

§ 102(e) Date: Aug. 27, 1996

[87] PCT Pub. No.: WO95/21516

PCT Pub. Date: Aug. 10, 1995

[30] Foreign Application Priority Data

Feb. 2, 1994 [DE] Germany ............................ 44 03 125.4

[51] Int. Cl.⁶ .................................................. B23K 10/00
[52] U.S. Cl. ............................ 219/121.43; 219/121.52; 156/345; 315/111.51
[58] Field of Search ........................ 219/121.43, 121.44, 219/121.52, 123; 156/643, 345, 646; 315/111.21–111.81; 118/723 AN

[56] References Cited

U.S. PATENT DOCUMENTS

| | | | |
|---|---|---|---|
| 4,713,585 | 12/1987 | Ohno et al. | 315/111.81 |
| 4,810,935 | 3/1989 | Boswell | 315/111.41 |
| 5,091,049 | 2/1992 | Campbell et al. | 156/643 |
| 5,122,251 | 6/1992 | Campbell et al. | 204/298.06 |
| 5,133,825 | 7/1992 | Hakamata et al. | 156/345 |
| 5,401,318 | 3/1995 | Pearson | 118/723 AN |
| 5,401,350 | 3/1995 | Patrick et al. | 156/345 |

OTHER PUBLICATIONS

Hopwood, B.J., in Plasma Sources Sci. Technol. 1 (1992) 109–116.

*Primary Examiner*—Mark H. Paschall
*Attorney, Agent, or Firm*—Karl Hormann

[57] ABSTRACT

The invention relates to an apparatus for generating A plasma generating apparatus of the kind useful for plasma-assisted processing of substrates, and provided with a plurality of substantially cylindrical plasma generating chambers each surrounded by an annular antenna connected to a source of high frequency energy by feed lines connected to the antenna at diagonally opposite points thereof, each chamber being further provided with a device for generating a longitudinal magnetic field within the chamber.

9 Claims, 3 Drawing Sheets

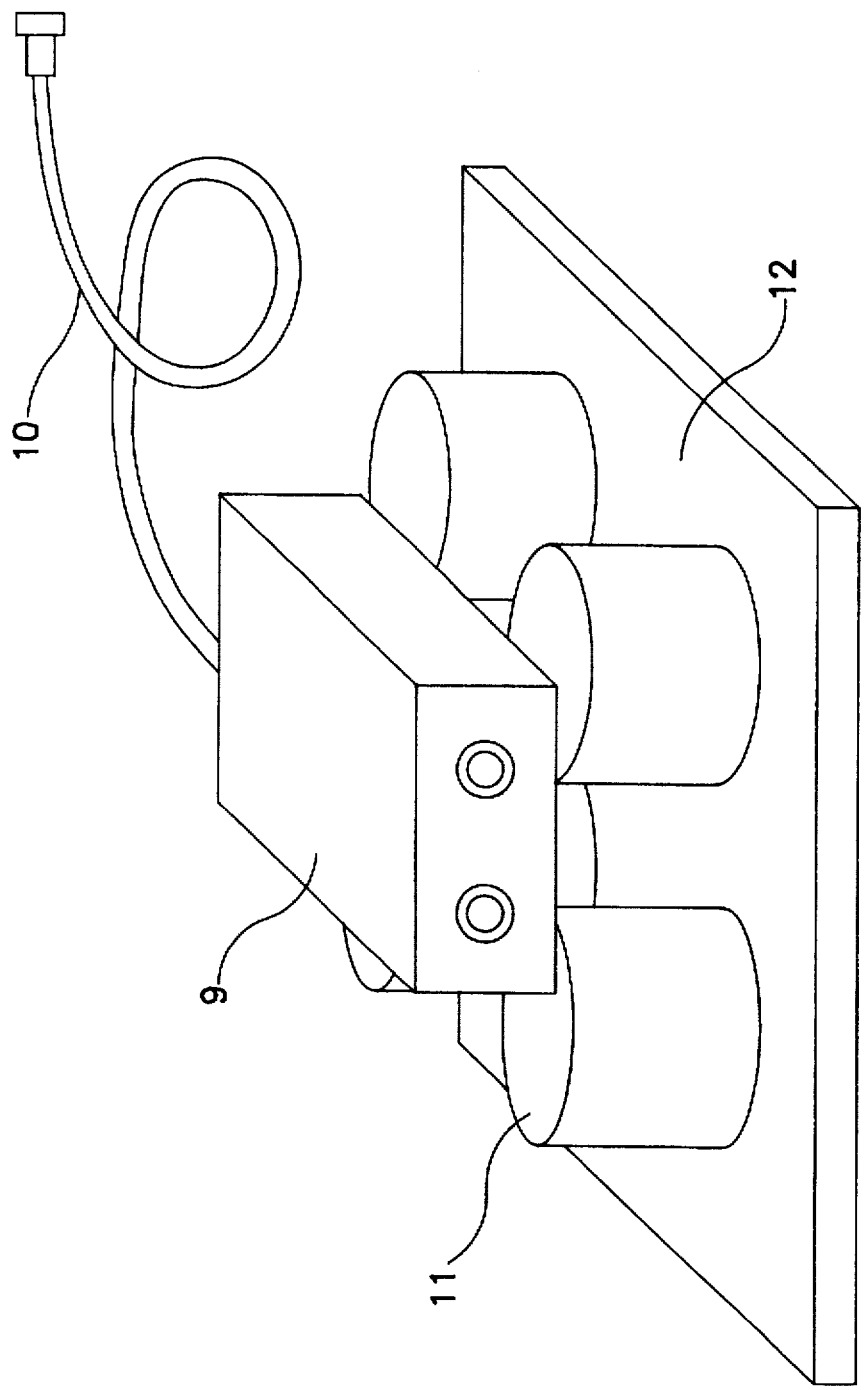

APPARATUS FOR GENERATING A PLASMA FOR PROCESSING SUBSTRATES

BACKGROUND OF THE INVENTION

1. Technical Field

The invention relates to an apparatus for generating a plasma by inductive coupling of high frequency (HF) energy for the plasma-supported processing of substrates.

Plasma processes are used increasingly in the technical treatment of surfaces or layers close to a surface. It may relate to the precipitation of layers, the hardening of surfaces, to the removal of a layer, or to cleaning processes.

Different methods are available for generating a plasma, such as, for instance, electron-cyclotron-resonance or straight capacitive energy coupling. In the case at hand the plasma generation is accomplished by an inductive coupling of HF energy through an especially configured antenna. There is a survey by B. J. Hopwood of this kind of plasma generation in Plasma Sources Sci. Technol. 1 (1992), 109-116.

2. State of the Art

The problem inherent in inductive coupling is that electric potentials are created on the antenna because of its finite inductance, which lead to a capacitive (E field) component of the excitation. This capacitive component is undesirable as it leads to high plasma potentials which detrimentally affect any directed treatment of a substrate.

A further problem relates to the generation of uniform plasmas over large areas, for instance, in the treatment of flat panel displays. Scaling up existing plasma sources quickly encounters technical limitations. An arbitrarily sized area of homogenous plasma density may, however, be provided by a surface array of an arbitrary number of conventionally sized individual sources. Such apparatus have been described, for instance, in U.S. Pat. Nos. 4,713,585 or 5,133,825. Compactly structured and inherently superficial plasma sources are especially suitable as individual sources.

U.S. Pat. No. 5,122,251 discloses a device for generating plasma by inductive coupling of HF energy, comprising a cylindrical plasma generating chamber which is open at one side, a gas input conduit and an antenna which partially encloses the plasma generating chamber in a plane normal to its longitudinal axis. The device is additionally provided with means arranged around the plasma generating chamber for establishing a longitudinal magnetic field within the plasma generating chamber, as well as with a device for exciting the antenna with HF energy. The antenna is configured as an open loop with the feedlines positioned side-by-side at one side of the plasma generating chamber. The particularly simple configuration of the antenna results in a compact structure of the plasma source.

An improvement of the disclosed device consists of a side-by-side arrangement of a plurality of series-connected plasma generation chambers and associated antennae connected to a common matching circuit (match box) and fed from a single HE transmitter. This makes it possible to treat larger surfaces.

The device does, however, suffer from the disadvantage mentioned above, that is the capacitive component of the plasma excitation resulting from the inductance of the antenna detrimentally affecting a directed substrate treatment.

BRIEF SUMMARY OF THE INVENTION

It is an object of the present invention to provide a compact apparatus for generating a plasma by inductive coupling of HF energy which by comparison with to existing devices, has a significantly lower capacitive plasma excitation component.

In accordance with the invention, the object is accomplished by an apparatus for generating a plasma for the plasma-supported processing of substrates, having a plurality of plasma generating chambers of substantially cylindrical configuration arranged in side by side relationship, an annular antenna surrounding each chamber in a plane disposed normal to the longitudinal axis of the chamber for inductively coupling high frequency energy into each chamber, a device for establishing a longitudinal magnetic field in each of said chambers, and high frequency feed lines respectively connected to diagonally opposite points of said antenna and a source of high frequency. Special embodiments of the invention are defined in the subclaims.

The apparatus in accordance with the invention is characterized by a specially structured antenna. The antenna is configured as an integral closed ring which entirely encloses the plasma generating chamber in a plane normal to its longitudinal axis. A HF generator is connected to the antenna by a matching circuit. The feed lines for the antenna current are connected to the ring of the antenna at opposite points. In this manner, the current flow on the antenna is symmetrical. At each voltage half-wave the current flows through both halves of the ring, commencing at a feed line, to the opposite feed line. This corresponds to a parallel circuit of two inductances (the first half ring and the second half ring) so that the total inductance of the antenna corresponds to half the inductance of one half ring.

Comparing this inductance with the antenna inductance of U.S. Pat. No. 5,122,251 mentioned in the introduction of this specification points out the advantages of the apparatus in accordance with the invention. In that antenna, current flows around the loop from one feed line and around almost the entire plasma generating chamber to the other feed line. This corresponds to a series-connection of two inductances (the first half loop and the second half loop), i.e., a total induction of twice the inductance of a single half loop. By comparison, the inductance on the antenna of the apparatus in accordance with the invention is only ¼ of that induction so that lower electrical potentials occur on the antenna. The apparatus in accordance with the invention is, therefore, advantageously characterized by a significantly lower capacitive plasma excitation component.

In an especial embodiment of the apparatus in accordance with the invention, a plurality of plasma generating chambers are placed as individual sources in a side-by-side arrangement. Since the transverse plasma distribution at the open side of a single plasma generating chamber in an apparatus in accordance with the invention is slightly bell shaped, the above arrangement, with a suitable spacing of the individual sources, makes it possible to produce a homogeneous distribution of plasma density with a large surface coverage. In that context, the compact structure of the individual source is of particular advantage. Each individual source consists of a plasma generating chamber including a gas feed conduit, an antenna and a device for establishing a longitudinal magnetic field in the chamber, as well as feed lines for the antenna. A plurality of sequentially arranged individual sources are fed in parallel from a common HF transmitter provided with a matching circuit (match box). In the present case of a pure inductive plasma excitation this is not critical. The high frequency current on each antenna can be calculated exactly in accordance with $I = U/jwL$, wherein U represents the octagon (complex) antenna voltage, w is the frequency of the circuit and L is the antenna inductance of an individual source. Provided the antenna is short, the reaction of the plasma to the inductance of the antenna is very small, so that if a symmetrical construction (the same antenna lengths at all the plasma sources) is maintained, the antenna currents obtained will be identical. These currents generate the plasma by generating corresponding plasma electron eddy currents. This ensures a uniform constant plasma excitation by a plurality of individual sources connected in parallel.

By contrast, the disadvantage of series-connected individual sources as realized in U.S. Pat. No. 5,122,251 referred to above is that, on the one hand, the individual antenna currents are not identical and that, on the other hand, different potentials occur at the individual antennas which affect different capacitive couplings into the plasma.

In the special embodiment of the apparatus in accordance with the invention, the individual sources are preferably spaced such that the ratio of spacing to the inner diameter of the plasma generating chambers is from 1.5 to 3.

The apparatus in accordance with the invention will hereafter be described in more detail on the basis of an embodiment and the drawings, in which:

FIG. 3 is a schematic presentation of a plurality of individual sources for generating a large-surface plasma.

DETAILED DESCRIPTION OF THE PREFERRED EMBODIMENT

Figure 1:
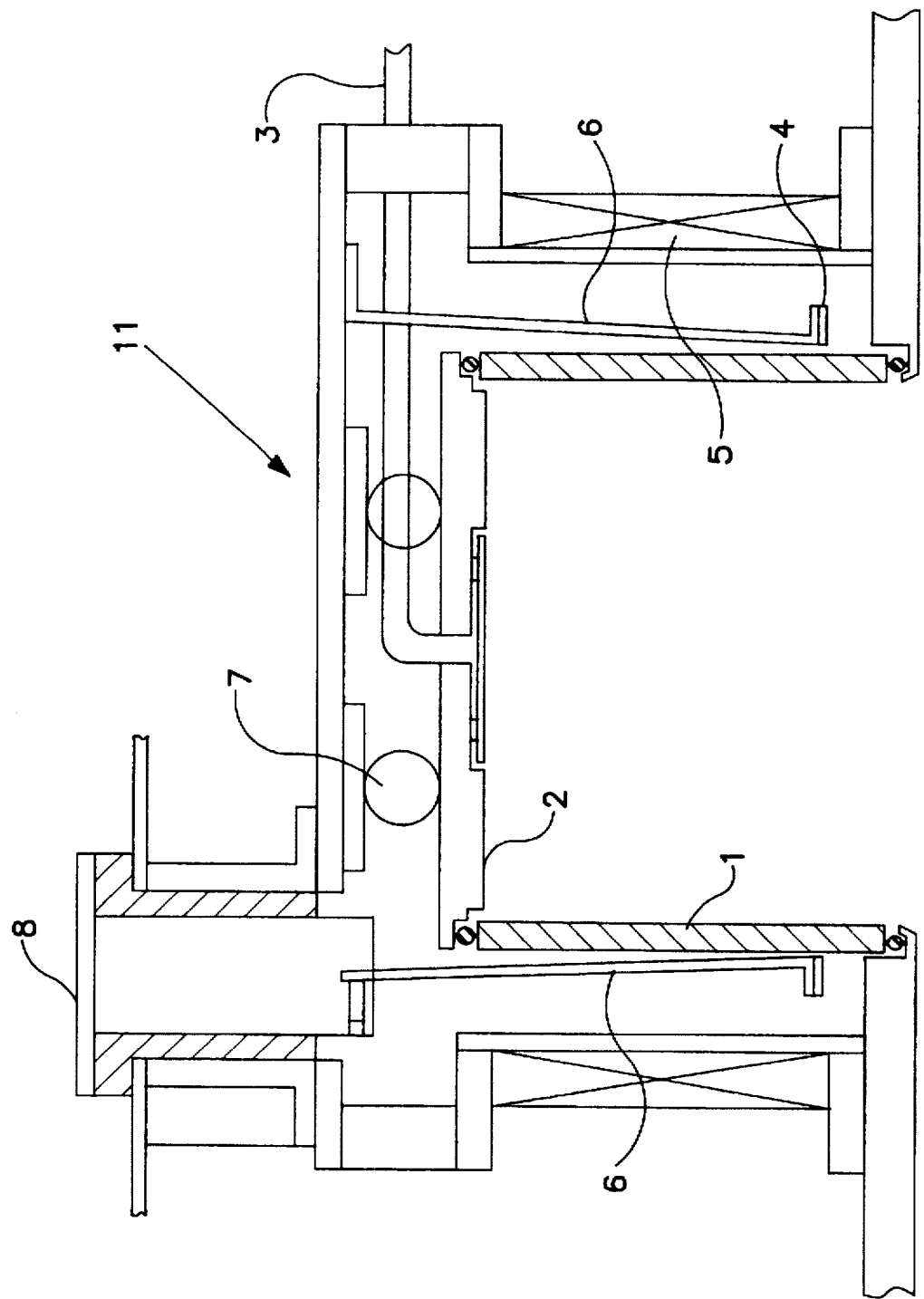
FIG. 1 is a longitudinal section of a preferred embodiment of the apparatus in accordance with the invention (individual source)

An example of the arrangement in accordance with the invention is shown in longitudinal section in FIG. 1. The plasma generating chamber of this individual source is provided by a quartz cylinder 1 which at its upper end is gas-imperviously sealed by a flanged lid 2 grounded by pressure springs 7. The lower open end of the quartz cylinder leads to a process chamber (not shown in FIG. 1) where substrate treatment takes place. The gas feed conduit 3 is integrated into the flanged lid 2. At its lower end, the quartz cylinder is surrounded by the annular antenna 4 the feed lines 6 of which extend substantially parallel to the longitudinal axis of the quartz cylinder and are connected to a match box contact 8. Of course, the feed lines may also extend at any other angle relative to the longitudinal axis of the plasma generating chamber. The associated match box (configured as a matching circuit) and the HF generator have not been shown in the figure. Quartz cylinder and antenna (including feed lines) are enclosed by a magnetic coil 5 which establishes a longitudinal magnetic field in the plasma generating chamber.

The coil body of the magnetic field coil 5 also serves as a shield against high frequency fields radiated from the antenna to exterior space. Hence, a very compact structure is obtained as regards both structural height (because of the simple antenna structure) and external diameter (no additional shield) of the source. The structure of the antenna makes it also possible to operate the source with low coil fields so that the coil of the magnet may be kept very compact.

Figure 2:
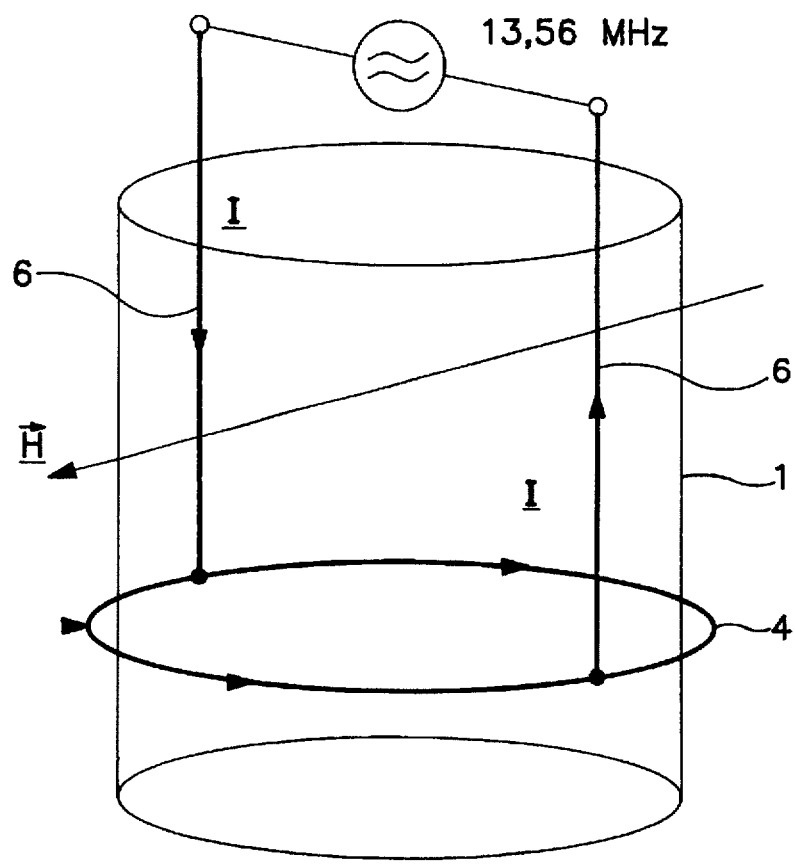
FIG. 2 is a schematic presentation of the configuration and arrangement of the antenna of the apparatus in accordance with the invention.

The antenna 4 is shown schematically in FIG. 2. The quartz cylinder 1 of the plasma generating chamber is annularly surrounded by the antenna. The feed lines 6 are connected to the antenna ring at opposite points thereof. The excitation high frequency magnetic field H points in a transverse direction (normal to the longitudinal axis of the cylinder; see FIG. 2), so that this antenna structure permits the excitation of the m=1 mode of an electromagnetic wave, i.e., the so-called Whistler wave. Preferably, the antenna is fed at a frequency of 13.56 MHZ from a high frequency generator with associated matching circuit. At each half-wave of the antenna voltage current flow I commences symmetrically in both halves of the ring from one feed line to the other feed line, as may be seen in FIG. 2. Because of the resulting low inductance of the antenna of about 0.1 μH (length of the quartz cylinder 10 cm, External diameter of the quartz cylinder 15 cm) only very low potentials are established on the antenna, so that the capacitive (E field) excitation component resulting therefrom is negligible relative to the inductive (H field). Hence, no electrostatic shielding is required between quartz cylinder and antenna.

FIG. 3 schematically depicts an apparatus for large surface plasma generation, assembled of four individual sources 11 of the kind shown in FIG. 1. The four individual sources are fed in parallel from a single HF generator (the HF generator connector 10 is shown in the figure) and matching circuit (match box 9). At their open lower end the individual sources which are spaced at a minimum distance from each other are connected to a common process chamber (of which only the cover plate 12 is shown in the Figure) for substrate treatment. With the apparatus shown it is possible to generate large surface homogenous plasmas for processing large substrate surfaces.

What is claimed is:

1. An apparatus for generating a plasma for the plasma-supported processing of substrates, comprising:
   a plurality of substantially cylindrical plasma generating chamber means arranged in side by side relationship;
   closed annular antenna means surrounding each of said plasma generating chambers in a plane disposed substantially normal to the longitudinal axis of each of said plasma generating chambers for coupling high frequency energy thereinto;
   means for establishing a longitudinal magnetic field in each of said plasma generating chambers;
   means for exciting said antenna means with high frequency energy; and
   feed line means for connecting diagonal points of said annular antenna means with said means for exciting.

2. The apparatus in accordance with claim 1, wherein said means for establishing a longitudinal magnetic field in each of said chamber means comprises electromagnetic coil means surrounding each of said plasma generating chamber means and said antenna means.

3. The apparatus in accordance with claim 2, wherein said feed line means of said antenna means extends substantially parallel to said longitudinal axis of said plasma generating chamber means.

4. The apparatus in accordance with claim 3, wherein said means for exciting said antenna means with high frequency energy comprises high frequency generator means and matching circuit means for exciting said antenna means with a frequency of 13.56 MHZ.

5. The apparatus in accordance with claim 3, wherein each of said plasma generating chamber means comprises open-ended quartz cylinder means closed gas-imperviously at one end by flanged lid means provided with integral gas feed conduit means.

6. Apparatus in accordance with one of claims 1 to 5, characterized by the fact that the plasma generating chambers are arranged sequentially in such a manner that the ratio between spacing and internal diameter of the plasma generating chambers is between 1.5 and 3.

7. The apparatus in accordance with claim 5, wherein said antenna means surrounds said quartz cylinder means adjacent the open end thereof opposite said flanged lid means.

8. The apparatus in accordance with claim 7, wherein said electromagnetic coil means extends over more than 80% of the length of each of said quartz cylinder means.

9. The apparatus in accordance with claim 1, wherein said plasma generating chamber means are arranged in side by side relationship such the ratio between the spacing between individual such chamber means and the internal diameter of each such chamber means is between 1.5 and 3.

* * * * *